United States Patent
See et al.

(10) Patent No.: US 9,143,172 B2
(45) Date of Patent: Sep. 22, 2015

(54) TUNABLE MATCHING CIRCUITS FOR POWER AMPLIFIERS

(75) Inventors: Puay Hoe See, San Diego, CA (US); Aristotele Hadjichristos, San Diego, CA (US); Gurkanwal Singh Sahota, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/544,177

(22) Filed: Aug. 19, 2009

(65) Prior Publication Data
US 2010/0308933 A1 Dec. 9, 2010

Related U.S. Application Data

(60) Provisional application No. 61/183,877, filed on Jun. 3, 2009.

(51) Int. Cl.
*H03F 3/04* (2006.01)
*H04B 1/04* (2006.01)
*H03F 1/56* (2006.01)
(Continued)

(52) U.S. Cl.
CPC .............. *H04B 1/0458* (2013.01); *H03F 1/565* (2013.01); *H03F 3/24* (2013.01); *H03F 3/72* (2013.01); *H03F 2200/111* (2013.01); *H03F 2200/378* (2013.01); *H03F 2200/387* (2013.01); *H03F 2203/7209* (2013.01)

(58) Field of Classification Search
USPC ...................................... 330/305, 295, 124 R
IPC .......................................................... H03F 3/04
See application file for complete search history.

(56) References Cited

U.S. PATENT DOCUMENTS

| 4,015,223 A | 3/1977 | Cheze |
| 4,263,653 A | 4/1981 | Mecklenburg |

(Continued)

FOREIGN PATENT DOCUMENTS

| CN | 1282140 A | 1/2001 |
| CN | 1367952 A | 9/2002 |

(Continued)

OTHER PUBLICATIONS

International Search Report and Written Opinion—PCT/US2010/037322—ISA/EPO—Aug. 19, 2010.

(Continued)

*Primary Examiner* — Patricia Nguyen
(74) *Attorney, Agent, or Firm* — Ramin Mobarhan

(57) ABSTRACT

Tunable matching circuits for power amplifiers are described. In an exemplary design, an apparatus may include a power amplifier and a tunable matching circuit. The power amplifier may amplify an input RF signal and provide an amplified RF signal. The tunable matching circuit may provide output impedance matching for the power amplifier, may receive the amplified RF signal and provide an output RF signal, and may be tunable based on at least one parameter effecting the operation of the power amplifier. The parameter(s) may include an envelope signal for the amplified RF signal, an average output power level of the output RF signal, a power supply voltage for the power amplifier, IC process variations, etc. The tunable matching circuit may include a series variable capacitor and/or a shunt variable capacitor. Each variable capacitor may be tunable based on a control generated based on the parameter(s).

22 Claims, 11 Drawing Sheets

(51) Int. Cl.
*H03F 3/24* (2006.01)
*H03F 3/72* (2006.01)

(56) References Cited

U.S. PATENT DOCUMENTS

| | | | |
|---|---|---|---|
| 4,375,051 A | 2/1983 | Theall | |
| 4,493,112 A | 1/1985 | Bruene | |
| 4,559,503 A | 12/1985 | Camand et al. | |
| 4,612,669 A | 9/1986 | Nossen | |
| 5,023,688 A | 6/1991 | Ando et al. | |
| 5,208,537 A | 5/1993 | Rietsch et al. | |
| 5,300,068 A * | 4/1994 | Rosar et al. | 606/34 |
| 5,361,403 A | 11/1994 | Dent | |
| 5,483,680 A | 1/1996 | Talbot | |
| 5,530,923 A | 6/1996 | Heinonen et al. | |
| 5,541,554 A | 7/1996 | Stengel et al. | |
| 5,564,086 A * | 10/1996 | Cygan et al. | 455/126 |
| 5,673,287 A | 9/1997 | Colvis et al. | |
| 5,774,017 A | 6/1998 | Adar | |
| 5,778,308 A | 7/1998 | Sroka et al. | |
| 5,969,582 A | 10/1999 | Boesch et al. | |
| 5,973,557 A * | 10/1999 | Miyaji et al. | 330/51 |
| 5,978,192 A | 11/1999 | Young et al. | |
| 6,020,794 A | 2/2000 | Wilbur | |
| 6,166,598 A | 12/2000 | Schlueter | |
| 6,188,877 B1 | 2/2001 | Boesch et al. | |
| 6,215,359 B1 | 4/2001 | Peckham et al. | |
| 6,317,608 B1 | 11/2001 | Glocker | |
| 6,362,690 B1 | 3/2002 | Tichauer | |
| 6,370,364 B1 | 4/2002 | Liimatainen | |
| 6,389,269 B1 | 5/2002 | Nanni et al. | |
| 6,414,562 B1 | 7/2002 | Bouisse et al. | |
| 6,441,768 B2 | 8/2002 | Cho et al. | |
| 6,570,462 B2 | 5/2003 | Edmonson et al. | |
| 6,603,351 B2 | 8/2003 | Suzuki | |
| 6,606,483 B1 | 8/2003 | Baker et al. | |
| 6,759,916 B2 | 7/2004 | Ishizaki et al. | |
| 6,771,130 B2 | 8/2004 | Hasegawa et al. | |
| 6,859,104 B2 | 2/2005 | Toncich et al. | |
| 6,865,399 B2 | 3/2005 | Fujioka et al. | |
| 6,946,847 B2 * | 9/2005 | Nishimori et al. | 324/600 |
| 6,950,637 B2 | 9/2005 | Kim | |
| 6,992,543 B2 | 1/2006 | Luetzelschwab et al. | |
| 7,009,455 B2 | 3/2006 | Toncich et al. | |
| 7,010,073 B2 | 3/2006 | Black et al. | |
| 7,126,386 B2 | 10/2006 | Tumer et al. | |
| 7,151,411 B2 | 12/2006 | Martin et al. | |
| 7,176,634 B2 | 2/2007 | Kitamura et al. | |
| 7,187,231 B2 * | 3/2007 | McGrath et al. | 330/51 |
| 7,202,734 B1 * | 4/2007 | Raab | 330/126 |
| 7,215,933 B1 | 5/2007 | Tse et al. | |
| 7,417,508 B1 * | 8/2008 | Quaglietta | 330/302 |
| 7,443,236 B2 | 10/2008 | Dow et al. | |
| 7,509,100 B2 | 3/2009 | Toncich | |
| 7,512,386 B2 * | 3/2009 | Kalajo et al. | 455/127.1 |
| 7,567,782 B2 * | 7/2009 | Liu et al. | 455/121 |
| 7,580,684 B2 * | 8/2009 | Cyr et al. | 455/75 |
| 7,616,054 B2 | 11/2009 | Jeon et al. | |
| 7,764,125 B2 | 7/2010 | Dawe | |
| 7,782,134 B2 * | 8/2010 | Drogi et al. | 330/136 |
| 7,868,699 B2 | 1/2011 | Ono et al. | |
| 7,893,763 B2 * | 2/2011 | Andrews | 330/136 |
| 7,893,769 B2 | 2/2011 | Asano | |
| 7,911,277 B2 * | 3/2011 | Paul et al. | 330/305 |
| 7,917,170 B2 | 3/2011 | Zhitnitsky | |
| 8,000,737 B2 | 8/2011 | Caimi et al. | |
| 8,018,277 B2 * | 9/2011 | Drogi et al. | 330/136 |
| 8,072,272 B2 | 12/2011 | Zhao et al. | |
| 8,111,111 B2 | 2/2012 | Van | |
| 8,131,232 B2 * | 3/2012 | Muhammad | 455/114.2 |
| 8,140,033 B2 | 3/2012 | Chan et al. | |
| 8,213,886 B2 | 7/2012 | Blin | |
| 8,280,323 B2 * | 10/2012 | Thompson | 455/126 |
| 8,306,490 B2 * | 11/2012 | Tanoue et al. | 455/127.2 |
| 8,368,470 B2 * | 2/2013 | Alidio et al. | 330/295 |
| 8,576,013 B2 * | 11/2013 | Coumou | 330/305 |
| 2001/0020911 A1 | 9/2001 | Cho et al. | |
| 2002/0094037 A1 | 7/2002 | Darabi et al. | |
| 2003/0060227 A1 | 3/2003 | Sekine et al. | |
| 2003/0184319 A1 * | 10/2003 | Nishimori et al. | 324/684 |
| 2003/0193997 A1 | 10/2003 | Dent et al. | |
| 2004/0132441 A1 | 7/2004 | Livet et al. | |
| 2004/0224649 A1 | 11/2004 | Shamsaifar | |
| 2005/0159119 A1 | 7/2005 | Kataoka et al. | |
| 2005/0221855 A1 | 10/2005 | Kuriyama et al. | |
| 2005/0225388 A1 | 10/2005 | Ramachandran et al. | |
| 2005/0227640 A1 | 10/2005 | Haque et al. | |
| 2006/0028301 A1 | 2/2006 | Kamata et al. | |
| 2006/0053321 A1 | 3/2006 | Mizusawa | |
| 2006/0160501 A1 | 7/2006 | Mendolia et al. | |
| 2006/0164162 A1 | 7/2006 | Dauphinee et al. | |
| 2006/0166664 A1 | 7/2006 | Livet et al. | |
| 2006/0261895 A1 | 11/2006 | Kocaman et al. | |
| 2007/0109698 A1 | 5/2007 | Kim | |
| 2007/0197180 A1 | 8/2007 | McKinzie, III | |
| 2007/0218844 A1 | 9/2007 | Alanen et al. | |
| 2007/0222523 A1 | 9/2007 | Arell | |
| 2007/0291173 A1 | 12/2007 | Hsin | |
| 2008/0242237 A1 | 10/2008 | Rofougaran et al. | |
| 2008/0266021 A1 | 10/2008 | Van Bezooijen et al. | |
| 2008/0284539 A1 | 11/2008 | Tateoka et al. | |
| 2009/0002077 A1 | 1/2009 | Rohani et al. | |
| 2009/0135536 A1 | 5/2009 | Kappes et al. | |
| 2009/0318093 A1 * | 12/2009 | Prikhodko et al. | 455/73 |
| 2010/0081410 A1 | 4/2010 | Kaido et al. | |
| 2010/0321086 A1 | 12/2010 | See et al. | |
| 2011/0018632 A1 | 1/2011 | Pletcher et al. | |
| 2011/0043956 A1 | 2/2011 | Su et al. | |
| 2011/0316636 A1 | 12/2011 | Zhao et al. | |
| 2012/0112834 A1 | 5/2012 | Van | |

FOREIGN PATENT DOCUMENTS

| | | |
|---|---|---|
| CN | 1677848 A | 10/2005 |
| CN | 1826727 A | 8/2006 |
| CN | 1870423 A | 11/2006 |
| CN | 101095285 A | 12/2007 |
| CN | 101432973 A | 5/2009 |
| CN | 101502004 A | 8/2009 |
| EP | 0982852 A2 | 3/2000 |
| EP | 1727279 A1 | 11/2006 |
| EP | 1916772 A1 | 4/2008 |
| GB | 2356093 A | 5/2001 |
| JP | S62262508 A | 11/1987 |
| JP | S6361812 U | 4/1988 |
| JP | H02161769 A | 6/1990 |
| JP | H03128336 U | 12/1991 |
| JP | H04207521 A | 7/1992 |
| JP | H04368022 A | 12/1992 |
| JP | H07263986 A | 10/1995 |
| JP | H08167819 A | 6/1996 |
| JP | 11055047 A | 2/1999 |
| JP | H11251928 A | 9/1999 |
| JP | 2000150779 A | 5/2000 |
| JP | 2000512460 A | 9/2000 |
| JP | 2001068941 A | 3/2001 |
| JP | 3192907 B2 | 7/2001 |
| JP | 2002535860 A | 10/2002 |
| JP | 2003504929 A | 2/2003 |
| JP | 2003087129 A | 3/2003 |
| JP | 2003516083 A | 5/2003 |
| JP | 2003174367 A | 6/2003 |
| JP | 2004085446 A | 3/2004 |
| JP | 2005045440 A | 2/2005 |
| JP | 2005128721 A | 5/2005 |
| JP | 2005210316 A | 8/2005 |
| JP | 2005524325 A | 8/2005 |
| JP | 2005268895 A | 9/2005 |
| JP | 2005294894 A | 10/2005 |
| JP | 2006074595 A | 3/2006 |
| JP | 2006279190 A | 10/2006 |
| JP | 2007013790 A | 1/2007 |
| JP | 2007503167 A | 2/2007 |
| JP | 2007060455 A | 3/2007 |

(56) References Cited

FOREIGN PATENT DOCUMENTS

| | | | |
|---|---|---|---|
| JP | 2007081593 A | 3/2007 | |
| JP | 2007104355 A | 4/2007 | |
| JP | 2007531470 A | 11/2007 | |
| JP | 2008516508 A | 5/2008 | |
| JP | 2008521318 A | 6/2008 | |
| JP | 2008521319 A | 6/2008 | |
| JP | 2008219758 A | 9/2008 | |
| JP | 2008288769 A | 11/2008 | |
| JP | 2010081383 A | 4/2010 | |
| WO | 9748183 A1 | 12/1997 | |
| WO | 0042585 A1 | 7/2000 | |
| WO | WO0105028 | 1/2001 | |
| WO | 0141306 A1 | 6/2001 | |
| WO | WO-03094345 A2 | 11/2003 | |
| WO | WO2004034569 | 4/2004 | |
| WO | 2005006832 A2 | 1/2005 | |
| WO | 2005020433 A2 | 3/2005 | |
| WO | 2005101649 A2 | 10/2005 | |
| WO | 2005101678 A2 | 10/2005 | |
| WO | WO2006038167 A1 | 4/2006 | |
| WO | WO-2006054245 A1 | 5/2006 | |
| WO | WO2006054246 A1 | 5/2006 | |
| WO | 2007107633 A1 | 9/2007 | |
| WO | 2008014029 A2 | 1/2008 | |
| WO | 2008114455 A1 | 9/2008 | |

OTHER PUBLICATIONS

Adar, A. et al., "A High Efficiency Single Chain GaAs MESFET MMIC Dual Band Power Amplifier for GSM/DCS Handsets", Gallium Arsenide Integrated Circuit (GaAs IC) Symposium, 1998. Technical Digest 1998., 20th Annual; Digital Object Identifier: 10.1109/GAAS.1998.722629; Publication Year: 1998, pp. 69-72.

Bezooijen A, et al., "Power Amplifier Protection by Adaptive Output Power Control", IEEE JSSC, vol. 42, No. 9, Sep. 2007, pp. 1834-1841.

Carrara F, et al., "A Methodology for Fast VSWR Protection Implemented in a Monolithic 3-W 55% PAE RF CMOS Power Amplifier", IEEE JSSC, vol. 43, No. 9, Sep. 2008, pp. 2057-2066.

Chowdhury D et al., "A single-chip highly linear 2.4GHz 30dBm power amplifier in 90nm CMOS", Solid-State Circuits Conference—Digest of Technical Papers, 2009, ISSCC 2009, IEEE International, IEEE, Piscataway, NJ, USA, Feb. 8, 2009, pp. 378-379, 379A, XP031466144, ISBN, 978-1-4244-3458-9.

Minsik Ahn, et al., "A Novel Multi-Stack Device Structure and its Analysis for High Power CMOS Switch Design", Microwave Symposium, 2007. IEEE/MTT-S International, IEEE, PI, Jun. 1, 2007, pp. 1393-1396, XP031112198, ISBN, 978-1-4244-0687-6.

Sanielevici S A, et al., "A 900-MHz Transceiver Chipset for Two-Way Paging Applications", IEEE JSSC, vol. 33, No. 12, Dec. 1998, pp. 2160-2168.

Scuderi A, et al., "A VSWR-Protected Silicon Bipolar RF Power Amplifiers with Soft-Slope Power Control", IEEE JSSC, vol. 40, No. 3, Mar. 2005, pp. 611-621.

Su D, et al., "An IC for Linearizing RF Power Amplifiers Using Envelope Elimination and Restoration", IEEE JSSC, vol. 33, No. 12, Dec. 1998, pp. 2252-2258.

Tongqiang Gao, et al., "A novel CMOS transmitter front-end for mobile RFID reader", Radio Frequency Integrated Circuits Symposium, 2009. RFIC 2009. IEEE, IEEE, Piscataway, NJ, USA, Jun. 7, 2009, pp. 105-108, XP031480236, ISBN, 978-1-4244-3377-3.

Vaha-Heikkila T. et al., "A 20-50 Ghz Reconfigurable Match Network for Power Amplifier Applications", Microwave Symposium Digest, 2004 IEEE MTT-S International; Volume: 2 Digital Object Identifier: 10.1109/MWSYM.2004.1339059; Publication Year: 2004, pp. 717-720 vol. 2.

Van Bezooijen, A., et al., "Adaptive Impedance-Matching Techniques for Controlling L Networks", Circuits and Systems I: Regular Papers, IEEE Transactions on; vol. 57, Issue: 2; Digital Object Identifier: 10.1 109/TCSI.2009.2023764 Feb. 2010, pp. 495-505.

Wang et al., "A Nonlinear Capacitance Cancellation Technique and its Application to a CMOS Class AB Power Amplifier," 2001, IEEE Radio Frequency Integrated Circuits Symposium, May 20, 2001, pp. 39-42, XP010551317.

Yao-Jen Chuang, et al., "A novel bubble tolerant thermometer-to-binary encoder for flash A/D converter", VLSI Design, Automation and Test, 2005. (VLSI-TSA-DAT). 2005 IEEE VLSI 20050427; 20050427—20050429 Piscataway, NJ, USA,IEEE, US, Apr. 27, 2005, pp. 315-318, XP010829593, DOI: DOI:10.1109/VDAT.2005. 1500084 ISBN: 978-0-7803-9060-7 the whole document.

* cited by examiner

TUNABLE MATCHING CIRCUITS FOR POWER AMPLIFIERS

I. CLAIM OF PRIORITY UNDER 35 U.S.C. §119

The present Application for Patent claims priority to Provisional Application Ser. No. 61/183,877, entitled "TUNABLE MATCHING CIRCUITS FOR POWER AMPLIFIERS," filed Jun. 3, 2009, assigned to the assignee hereof, and expressly incorporated herein by reference.

BACKGROUND

I. Field

The present disclosure relates generally to electronics, and more specifically to matching circuits for power amplifiers.

II. Background

A wireless communication device typically includes a transmitter to support data transmission. The transmitter may have a power amplifier to amplify a radio frequency (RF) signal and provide high output power. The power amplifier may be designed to drive a particular load impedance (e.g., 50 Ohms) and to have the best possible efficiency at the maximum output power level. The power amplifier may operate over a wide range of output power levels, and the efficiency of the power amplifier typically decreases at lower output power levels. It may be desirable to improve the efficiency of the power amplifier at lower output power levels, which may be much more common than the maximum output power level.

DETAILED DESCRIPTION

The word "exemplary" is used herein to mean "serving as an example, instance, or illustration." Any design described herein as "exemplary" is not necessarily to be construed as preferred or advantageous over other designs.

Tunable matching circuits that may improve the efficiency of power amplifiers are described herein. The tunable matching circuits may be used for various electronics devices such as wireless communication devices, cellular phones, personal digital assistants (PDAs), handheld devices, wireless modems, laptop computers, cordless phones, Bluetooth devices, consumer electronics devices, etc. For clarity, the use of the tunable matching circuits in a wireless communication device is described below.

Figure 1:
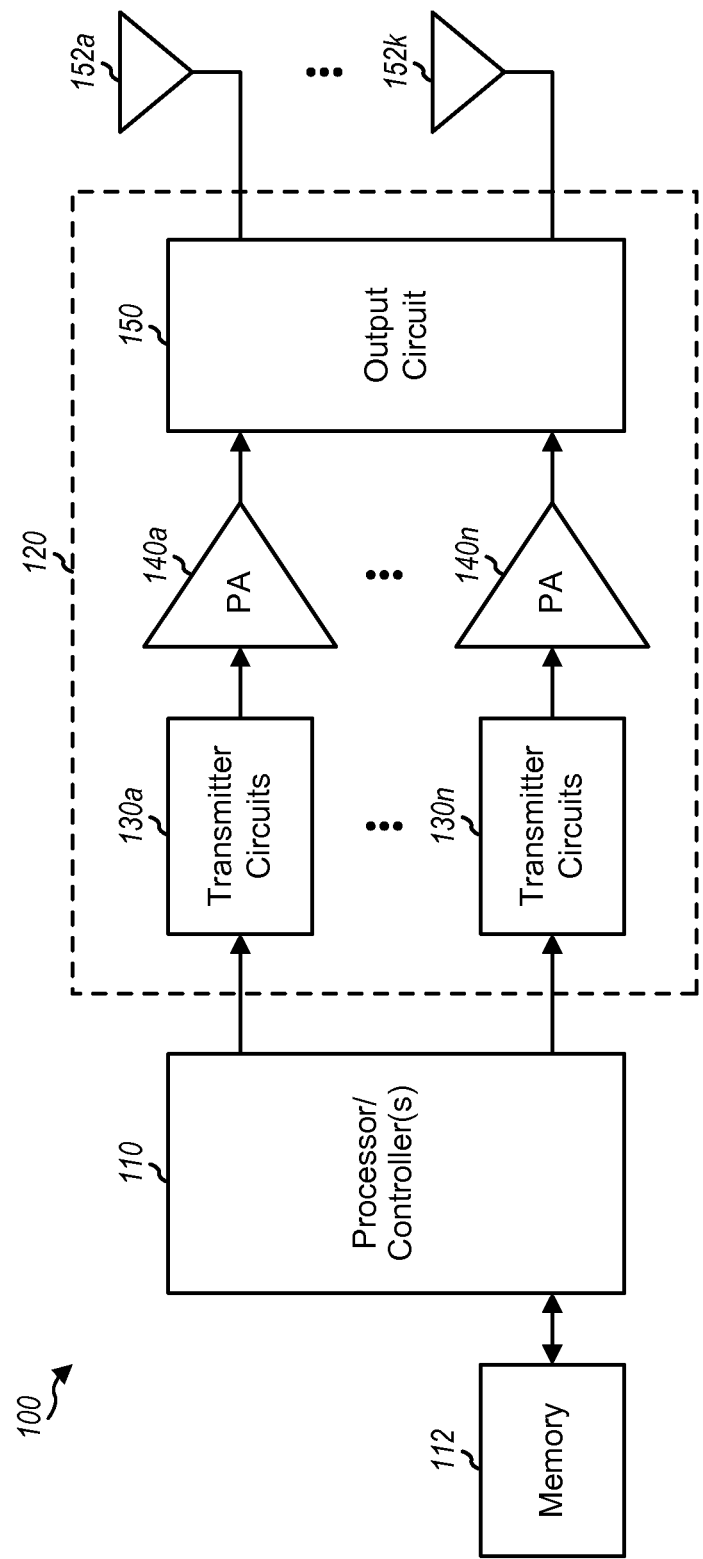
FIG. 1 shows a block diagram of a wireless communication device.

FIG. 1 shows a simplified block diagram of an exemplary design of a wireless communication device 100. In this exemplary design, wireless device 100 includes one or more processors/controllers 110, a memory 112, and a transmitter 120. In general, wireless device 100 may include any number of transmitters and any number of receivers for any number of communication systems and any number of frequency bands.

In the exemplary design shown in FIG. 1, transmitter 120 includes N transmit signal paths, where N may be any integer value. The N transmit signal paths may be for different radio technologies, different frequency bands, etc. Each transmit signal path includes transmitter circuits 130 and a power amplifier (PA) 140. An output circuit 150 couples to all N power amplifiers 140a through 140n and also to K antennas 152a through 152k, where K may be any integer value. Output circuit 150 may perform impedance matching for power amplifiers 140 and may also route one or more RF signals from one or more power amplifiers 140 to one or more antennas 152.

Processor(s) 110 process data to be transmitted via one or more transmit signal paths and provide an analog output signal to each transmit signal path. For each transmit signal path, transmitter circuits 130 amplify, filter, and upconvert the analog output signal for that transmit signal path and provide an input RF signal. Power amplifier 140 amplifies the input RF signal to obtain the desired output power level and provides an amplified RF signal to output circuit 150. Output circuit 150 performs impedance matching and switching and provides an output RF signal to a selected antenna 152.

FIG. 1 shows an exemplary design of transmitter 120. In general, the conditioning of the signals in transmitter 120 may be performed by one or more stages of amplifier, filter, mixer, etc. All or a portion of transmitter 120 may be implemented on one or more analog integrated circuits (ICs), RF ICs (RFICs), mixed-signal ICs, etc.

Processor/controller(s) 110 may perform various functions for wireless device 100, e.g., processing for data to be transmitted. Processor/controller(s) 110 may also control the operation of various circuits within wireless device 100. Memory 112 may store program codes and data for processor/controller(s) 110. Processor/controller(s) 110 and memory 112 may be implemented on one or more application specific integrated circuits (ASICs) and/or other ICs.

Figure 2:
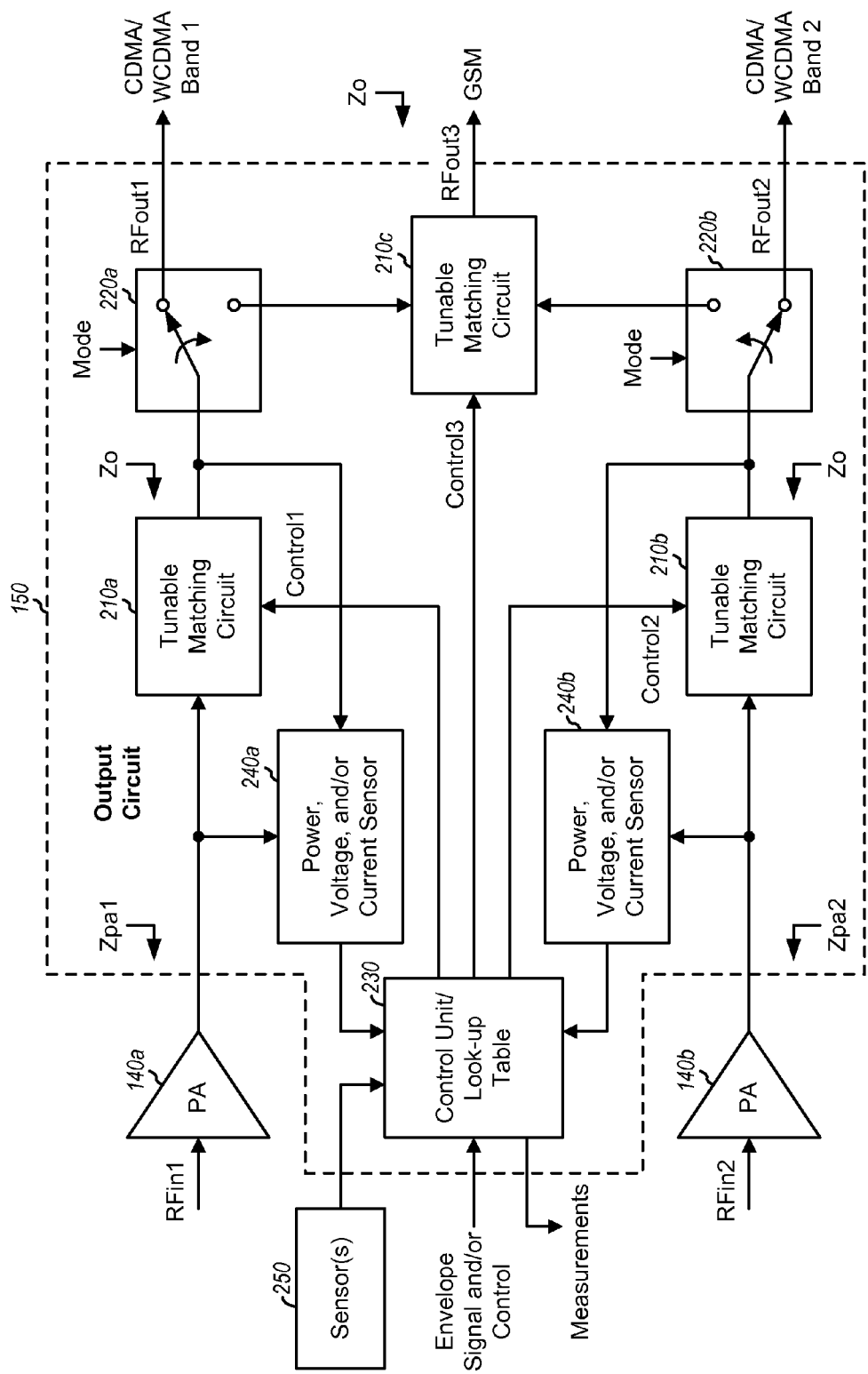
FIG. 2 shows a block diagram of two power amplifiers and an output circuit.

FIG. 2 shows a block diagram of an exemplary design of output circuit 150 for a case with two power amplifiers 140a and 140b for two transmit signal paths. A first transmit signal path may be for Code Division Multiple Access (CDMA) and/or Wideband CDMA (WCDMA) for a first frequency band (Band 1). A second transmit signal path may be for CDMA/WCDMA for a second frequency band (Band 2). A third output for Global System for Mobile Communications (GSM) may be formed by combining the outputs of the first and second transmit signal paths. In general, any number of transmit signal paths may be used to support any number of radio technologies, any radio technology, and any number of frequency bands.

Power amplifier 140a amplifies a first input RF signal (Rfin1) and provides a first amplified RF signal. Within output circuit 150, a tunable matching circuit 210a is coupled to the output of power amplifier 140a and provides output impedance matching for power amplifier 140a. A switch 220a couples a first output RF signal (Rfout1) from tunable matching circuit 210a to either a first output for CDMA/WCDMA Band 1 or a tunable matching circuit 210c. A sensor 240a receives the first amplified RF signal from power amplifier 140a and the first output RF signal from tunable matching circuit 210a. Sensor 240a may measure the power, voltage, and/or current of one or both RF signals and may provide measurements to a control unit 230. The measurements from sensor 240a may be used to characterize the impedance of tunable matching circuit 210a and/or the performance of the first transmit signal path. The measurements may be used to control/adjust tunable matching circuit 210a.

Power amplifier 140b amplifies a second input RF signal (RFin2) and provides a second amplified RF signal. Within output circuit 150, a tunable matching circuit 210b is coupled to the output of power amplifier 140b and provides output impedance matching for power amplifier 140b. A switch 220b couples a second output RF signal (RFout2) from tunable matching circuit 210b to either a second output for CDMA/WCDMA Band 2 or tunable matching circuit 210c. A sensor 240b receives the second amplified RF signal from power amplifier 140b and the second output RF signal from tunable matching circuit 210b. Sensor 240b may measure the power, voltage, and/or current of one or both RF signals and may provide measurements to control unit 230. The measurements from sensor 240b may be used to characterize the impedance of tunable matching circuit 210b and/or the performance of the second transmit signal path. The measurements may be used to control/adjust tunable matching circuit 210b.

Control unit 230 may receive an envelope signal for each active transmit signal path, information indicative of an average output power level of each active transmit signal path, and/or information for other parameters (e.g., frequency band, operating mode, etc.) affecting the operation of power amplifiers 140a and 140b, e.g., from processor/controller(s) 110 in FIG. 1. An active transmit signal path is a transmit signal path selected for use and is operating. Control unit 230 may also receive measurements (e.g., for power, voltage, current, etc.) from sensor 240 for each active transmit signal path. Control unit 230 may also receive measurements (e.g., for power supply voltage, temperature, etc.) from sensor(s) 250. Control unit 230 may generate at least one control (Control1 or Control2) for each tunable matching circuit 210 based on the received inputs to achieve good performance, e.g., to improve the efficiency of each active power amplifier 140. Control unit 230 may also provide measurements (e.g., for power, voltage, current, etc.) to processor/controller(s) 110, which may control the operation of tunable matching circuits 210, power amplifiers 140, etc.

A power amplifier may have a certain output impedance (Zpa) and may be designed to drive a particular load impedance (Zo). For example, the output impedance of the power amplifier may be approximately 4 Ohms whereas the load impedance may be 50 Ohms. A matching circuit may be used to match the PA output impedance to the load impedance in order to achieve good performance. The matching circuit may be a fixed matching circuit that may be designed to provide good performance (e.g., high PA efficiency) at the maximum output power level. However, this fixed matching circuit may provide sub-optimal performance (e.g., lower PA efficiency) at lower output power levels. The lower output power levels may occur much more frequently than the maximum output power level.

In an aspect, each tunable matching circuit 210 may provide tunable impedance matching for an associated power amplifier 140. In a first exemplary design, the tunable impedance matching may be dynamically varied based on an envelope signal indicative of the envelope of the amplified RF signal from power amplifier 140. In a second exemplary design, the tunable impedance matching may be varied based on an average output power level of the amplified RF signal from power amplifier 140. The first exemplary design may allow the tunable impedance matching to be varied at a relatively fast rate, e.g., on the order of microseconds (μs). The second exemplary design may allow the tunable impedance matching to be varied at a slower rate, e.g., on the order of milliseconds (ms) or slower. The envelope signal or the average output power level may be provided by processor(s) 110 based on the operating state of wireless device 100. In a third exemplary design, sensor 240 may measure the power, voltage, and/or current of the amplified RF signal and/or the output RF signal for tunable matching circuit 210. The measurements may be used to vary the tunable impedance matching. The tunable impedance matching may also be varied in other manners.

Figure 3:
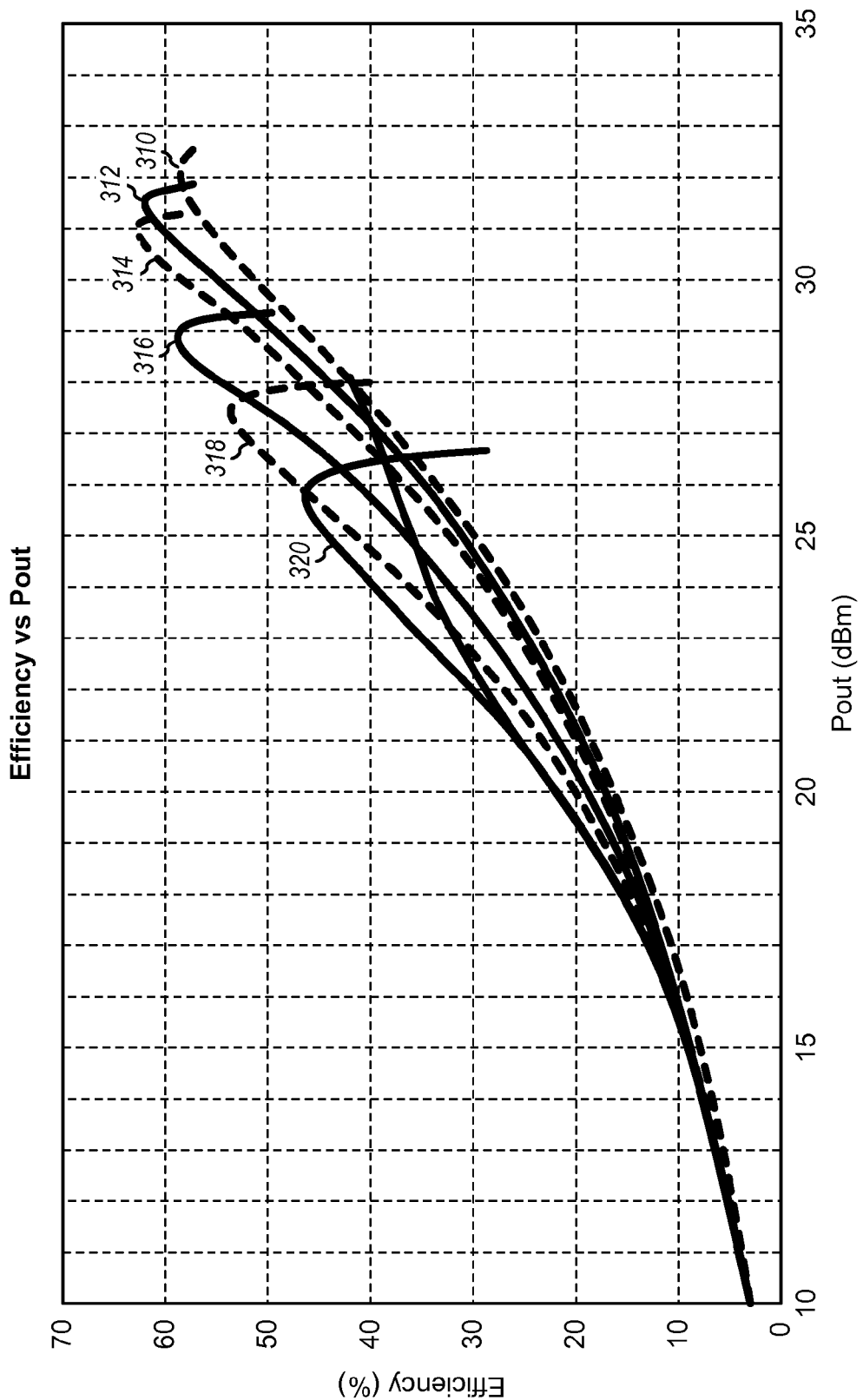
FIG. 3 shows efficiency versus output power with tunable impedance matching.

FIG. 3 shows plots of efficiency versus output power level (Pout) for a power amplifier with tunable impedance matching. The horizontal axis shows Pout, which is given in units of dBm. The vertical axis shows efficiency, which is given in percent (%). A plot 310 shows efficiency versus Pout for a nominal output impedance matching, which may be designed for the maximum output power level. Plots 312, 314, 316, 318 and 320 show efficiency versus Pout for five different impedance matching settings. Each impedance matching setting may correspond to a specific value for each configurable component (e.g., each variable capacitor) in a tunable matching circuit.

As shown in FIG. 3, different impedance matching settings may provide different efficiencies at different output power levels. For example, the impedance matching setting corresponding to plot 320 may provide better efficiency between 21 and 26 dBm but may be able to provide a peak output power level of 26 dBm. Different impedance matching settings may be used for different ranges of output power levels to maximize efficiency. For example, the setting corresponding to plot 320 may be used for 26 dBm or lower, the setting corresponding to plot 318 may be used between 26 dBm and 27.5 dBm, the setting corresponding to plot 316 may be used between 27.5 dBm and 29 dBm, the setting corresponding to plot 314 may be used between 29 dBm and 31 dBm, and the setting corresponding to plot 310 or 312 may be used above 31 dBm.

Tunable matching circuits 210a, 210b and 210c in FIG. 2 may be implemented in various manners. Some exemplary designs of tunable matching circuits 210 are described below.

Figure 4A:
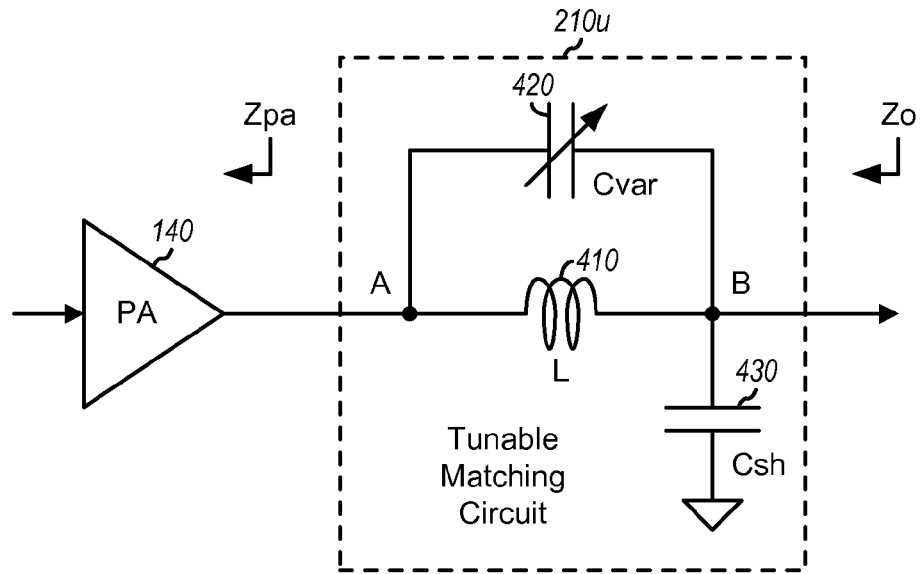
FIGS. 4A and 4B show a tunable matching circuit with tunable series reactance.

FIG. 4A shows an exemplary design of a single-stage tunable matching circuit 210u with tunable series reactance. Tunable matching circuit 210u may be used for any one of tunable matching circuits 210a, 210b and 210c in FIG. 2. In the exemplary design shown in FIG. 4A, tunable matching circuit 210u includes an inductor 410 and a variable capacitor 420 coupled in parallel and between the input (node A) and the output (node B) of tunable matching circuit 210u. A shunt capacitor 430 is coupled between node B and circuit ground. Capacitor 420 has a variable capacitance of Cvar, which may be varied within a range of Cmin to Cmax, or Cmin≤Cvar≤Cmax. Inductor 410 has a fixed inductance of L, and capacitor 430 has a fixed capacitance of Csh. The inductance L and the capacitances Csh and Cmin may be selected to obtain the nominal output impedance matching at the maximum output power level, e.g., to obtain plot 310 in FIG. 3. Different impedance matching settings may be obtained with different values of Cvar.

Series capacitor 420 may have a tendency to increase the inductance of inductor 410, which may be desirable. Capacitor 420 and inductor 410 also form a resonator with a resonant frequency determined by the capacitance of capacitor 420 and the inductance of inductor 410. The resonator has high impedance at the resonant frequency and may be used as a trap to attenuate an undesired harmonic of the amplified RF signal. For example, capacitor 420 may be varied such that the resonant frequency is at a second harmonic or a third harmonic of the amplified RF signal.

Figure 4B:
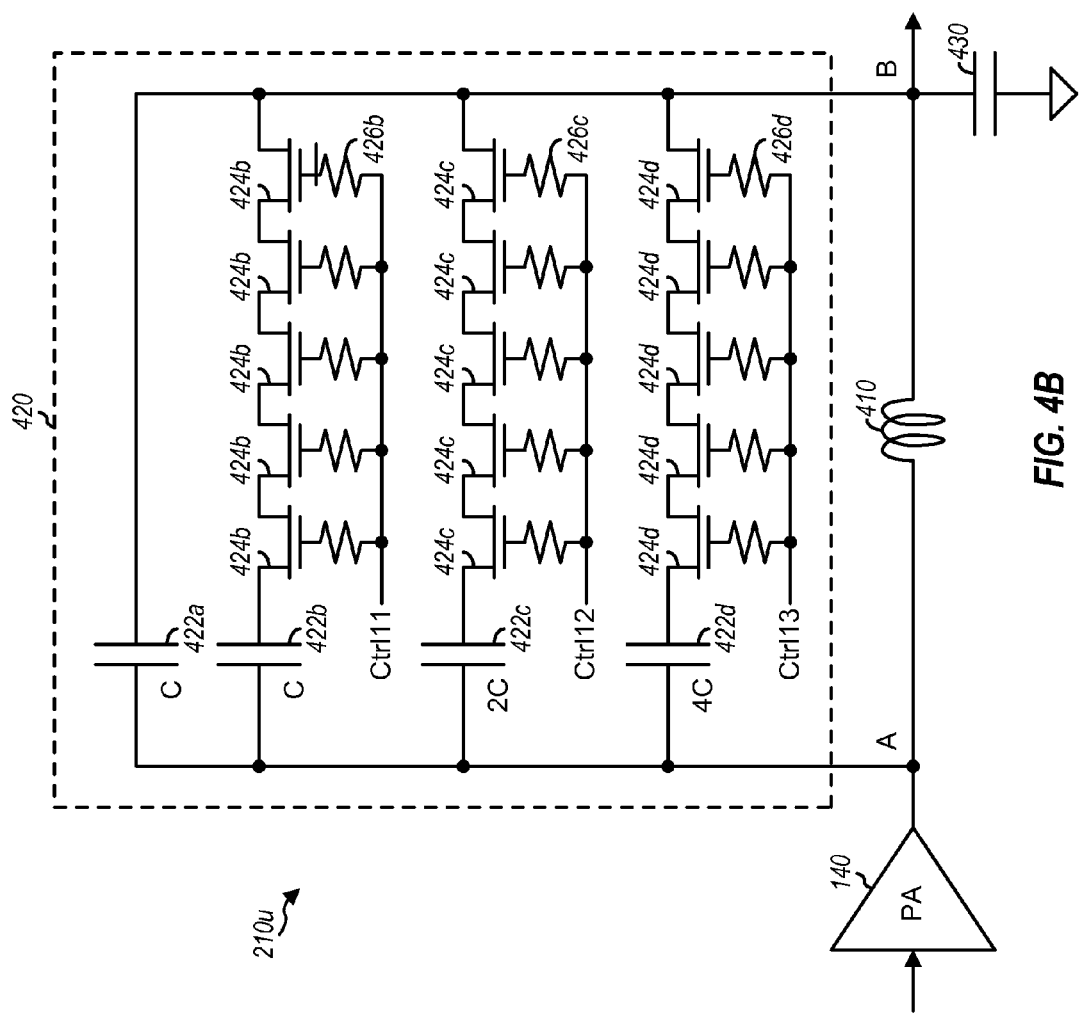

FIG. 4B shows an exemplary design of tunable matching circuit 210u in FIG. 4A using switchable capacitors. In the exemplary design shown in FIG. 4B, variable capacitor 420 is implemented with four capacitors 422a, 422b, 422c and 422d coupled in parallel. Capacitor 422a is a fixed capacitor that is always selected, and capacitors 422b, 422c and 422d are switchable capacitors that may each be selected or deselected.

Capacitor 422a is coupled directly between nodes A and B. Capacitor 422b is coupled in series with multiple (e.g., five) metal oxide semiconductor (MOS) transistors 424b, and the combination is coupled between nodes A and B. MOS transistors 424b operate as a switch that can connect or disconnect capacitor 422b from node B. Similarly, capacitor 422c is coupled in series with multiple (e.g., five) MOS transistors 424c, and the combination is coupled between nodes A and B. Capacitor 422d is coupled in series with multiple (e.g., five) MOS transistors 424d, and the combination is coupled between nodes A and B. The gates of MOS transistors 424b receive a Ctrl11 control signal via resistors 426b, the gates of MOS transistors 424c receive a Ctrl12 control signal via resistors 426c, and the gates of MOS transistors 424d receive a Ctrl13 control signal via resistors 426d. The Ctrl11, Ctrl12 and Ctrl13 control signals may be part of the Control1 or Control2 provided by control unit 230 in FIG. 2.

As shown in FIG. 4B, multiple MOS transistors 424 may be stacked together for each switch, so that only a fraction of the output RF signal is applied across each MOS transistor. MOS transistors 424 may have a small operating voltage in comparison to the output RF signal swing. The use of multiple MOS transistors 424 stacked together may improve reliability. The number of MOS transistors to stack together may be selected based on the rated operating voltage of the MOS transistors and the maximum output power level of the output RF signal.

The exemplary design shown in FIG. 4B uses binary weighting. Capacitor 422a may have a capacitance of C, capacitor 422b may also have a capacitance of C, capacitor 422c may have a capacitance of 2 C, and capacitor 422d may have a capacitance of 4 C. C may be one picoFarad (pF) or some other suitable capacitance value, which may be selected based on the frequency band of operation. In another exemplary design, thermometer decoding may be used, and capacitors 422a through 422d may have the same capacitance.

In general, any number of fixed and switchable capacitors may be used to form variable capacitor 420. Furthermore, each fixed or switchable capacitor may have any suitable capacitance value. Different impedance matching settings may be obtained with different combinations of switchable capacitors being selected. For example, eight different impedance matching settings ranging from C to 8 C may be obtained with eight different switching states for the three switches for capacitors 422b, 422c and 422d.

Figure 5A:
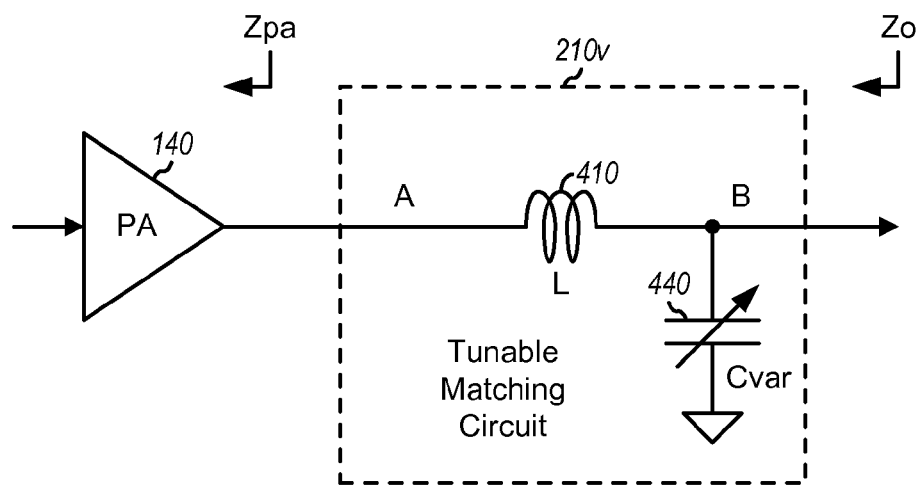
FIGS. 5A and 5B show a tunable matching circuit with tunable shunt reactance.

FIG. 5A shows an exemplary design of a single-stage tunable matching circuit 210v with tunable shunt reactance. Tunable matching circuit 210v may also be used for any one of tunable matching circuits 210a, 210b and 210c in FIG. 2. In the exemplary design shown in FIG. 5A, tunable matching circuit 210v includes inductor 410 coupled between the input (node A) and the output (node B) of tunable matching circuit 210v. A variable shunt capacitor 440 is coupled between node B and circuit ground. Inductor 410 has a fixed inductance of L, and capacitor 440 has a variable capacitance of Cvar. Different impedance matching settings may be obtained with different values of Cvar.

Figure 5B:
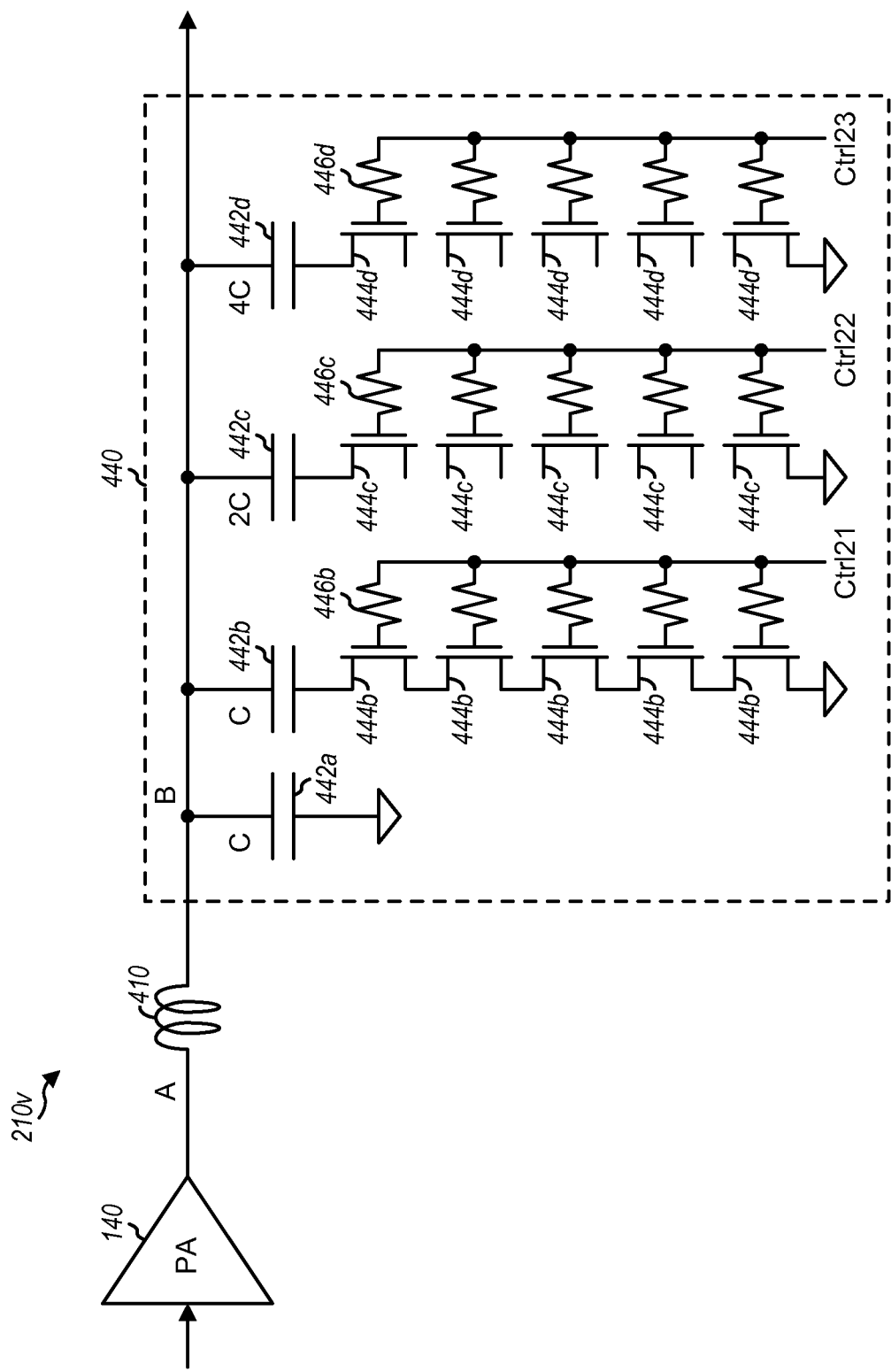

FIG. 5B shows an exemplary design of tunable matching circuit 210v in FIG. 5A using switchable capacitors. In the exemplary design shown in FIG. 5B, variable capacitor 440 is implemented with four capacitors 442a, 442b, 442c and 442d coupled in parallel. Capacitor 442a is a fixed capacitor that is always selected, and capacitors 442b, 442c and 442d are switchable capacitors that may each be selected or deselected.

Capacitor 442a is coupled directly between node B and circuit ground. Capacitor 442b is coupled in series with multiple (e.g., five) MOS transistors 444b, capacitor 442c is coupled in series with multiple MOS transistors 444c, and capacitor 442d is coupled in series with multiple MOS transistors 444d. The three series combinations of capacitor 442 and MOS transistors 444 are coupled between node B and circuit ground. The gates of MOS transistors 444b receive a Ctrl21 control signal via resistors 446b, the gates of MOS transistors 444c receive a Ctrl22 control signal via resistors 446c, and the gates of MOS transistors 444d receive a Ctrl23 control signal via resistors 446d. The Ctrl21, Ctrl22 and Ctrl23 control signals may be part of the Control1 or Control2 provided by control unit 230 in FIG. 2.

For binary weighting, capacitor 442a may have a capacitance of C, capacitor 442b may also have a capacitance of C, capacitor 442c may have a capacitance of 2 C, and capacitor 442d may have a capacitance of 4 C. For thermometer decoding, capacitors 422a through 422d may have the same capacitance. In general, any number of fixed and switchable capacitors may be used to form variable capacitor 440, and each fixed or switchable capacitor may have any suitable capacitance value.

Figure 6A:
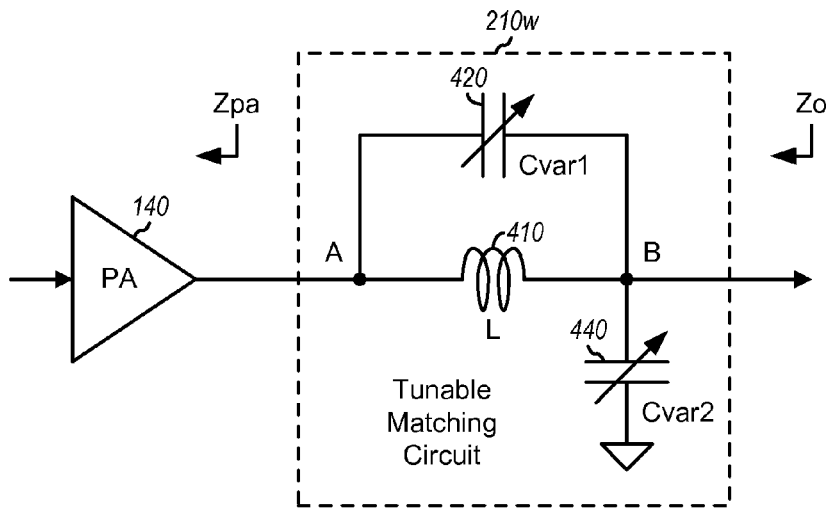
FIGS. 6A and 6B show a tunable matching circuit with tunable series and shunt reactance.

FIG. 6A shows an exemplary design of a single-stage tunable matching circuit 210w with tunable series and shunt reactance. Tunable matching circuit 210w may also be used for any one of tunable matching circuits 210a, 210b and 210c in FIG. 2. In the exemplary design shown in FIG. 6A, tunable matching circuit 210w includes inductor 410 and variable capacitor 420 coupled in parallel and between the input (node A) and the output (node B) of tunable matching circuit 210w. Variable shunt capacitor 440 is coupled between node B and circuit ground. Inductor 410 has a fixed inductance of L, capacitor 420 has a variable capacitance of Cvar1, and capacitor 440 has a variable capacitance of Cvar2. Different impedance matching settings may be obtained with different combination of values for Cvar1 and Cvar2.

Figure 6B:
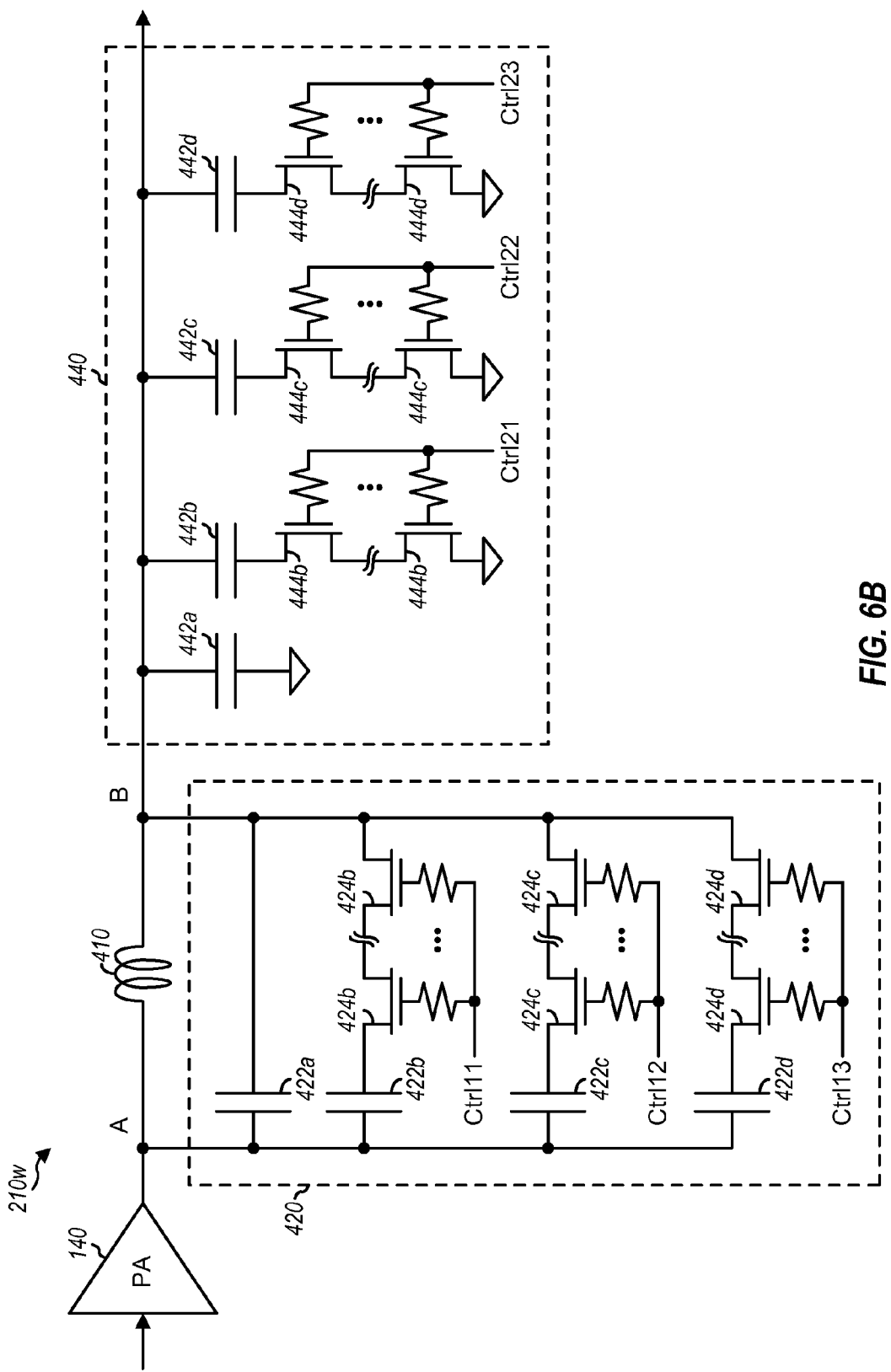

FIG. 6B shows an exemplary design of tunable matching circuit 210w in FIG. 6A using switchable capacitors. In the exemplary design shown in FIG. 6B, variable series capacitor 420 is implemented with four capacitors 422a, 422b, 422c and 422d and MOS transistors 424a, 424b, 424c and 424d, which are coupled as described above for FIG. 4B. Variable shunt capacitor 440 is implemented with four capacitors 442a, 442b, 442c and 442d and MOS transistors 444a, 444b, 444c and 444d, which are coupled as described above for FIG. 5B. Capacitors 422b, 422c and 422d may be selected or deselected by the Ctrl11, Ctrl12 and Ctrl13 control signals, respectively. Capacitors 442b, 442c and 442d may be selected or deselected by the Ctrl21, Ctrl22 and Ctrl23 control signals, respectively. In general, any number of fixed and switchable capacitors may be used to implement each of variable capacitors 420 and 440. Each fixed or switchable capacitor may have any suitable capacitance value.

Figure 7A:
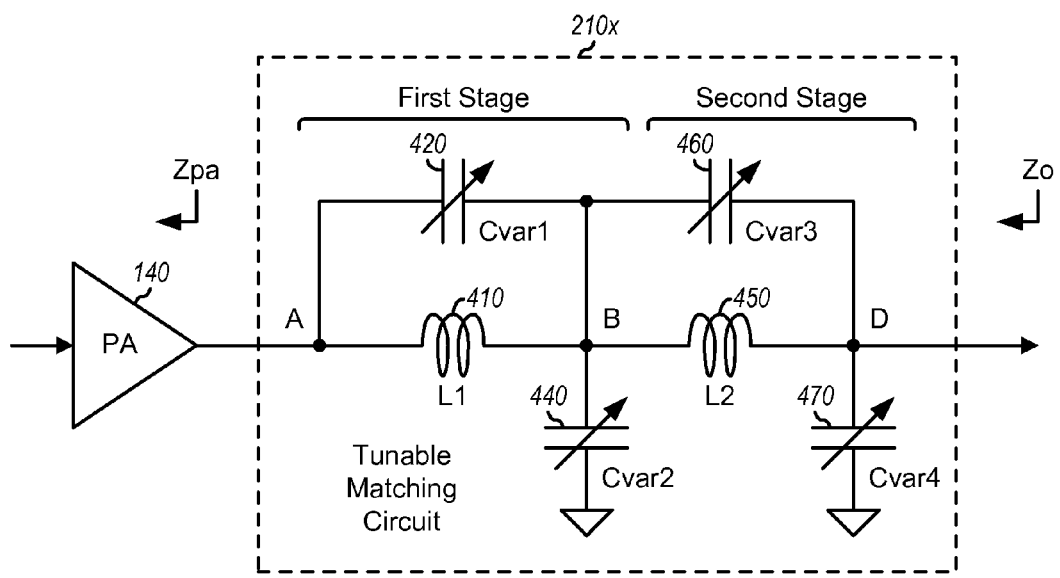
FIGS. 7A and 7B show a two-stage tunable matching circuit.

FIG. 7A shows an exemplary design of a two-stage tunable matching circuit 210x with tunable series and shunt reactance. Tunable matching circuit 210x may also be used for any one of tunable matching circuits 210a, 210b and 210c in FIG. 2. In the exemplary design shown in FIG. 7A, tunable matching circuit 210x includes a first stage comprising inductor 410, variable series capacitor 420, and variable shunt capacitor 440, which are coupled between nodes A and B as described above for FIG. 6A. Tunable matching circuit 210x further includes a second stage comprising an inductor 450, a variable series capacitor 460, and a variable shunt capacitor 470, which are coupled between nodes B and D in similar manner as the first stage. Different impedance matching settings may be obtained with different combinations of values for Cvar1, Cvar2, Cvar3 and Cvar4 for variable capacitors 420, 440, 460 and 470, respectively. Two stages may provide more degree of freedom to tune the impedance matching.

Figure 7B:
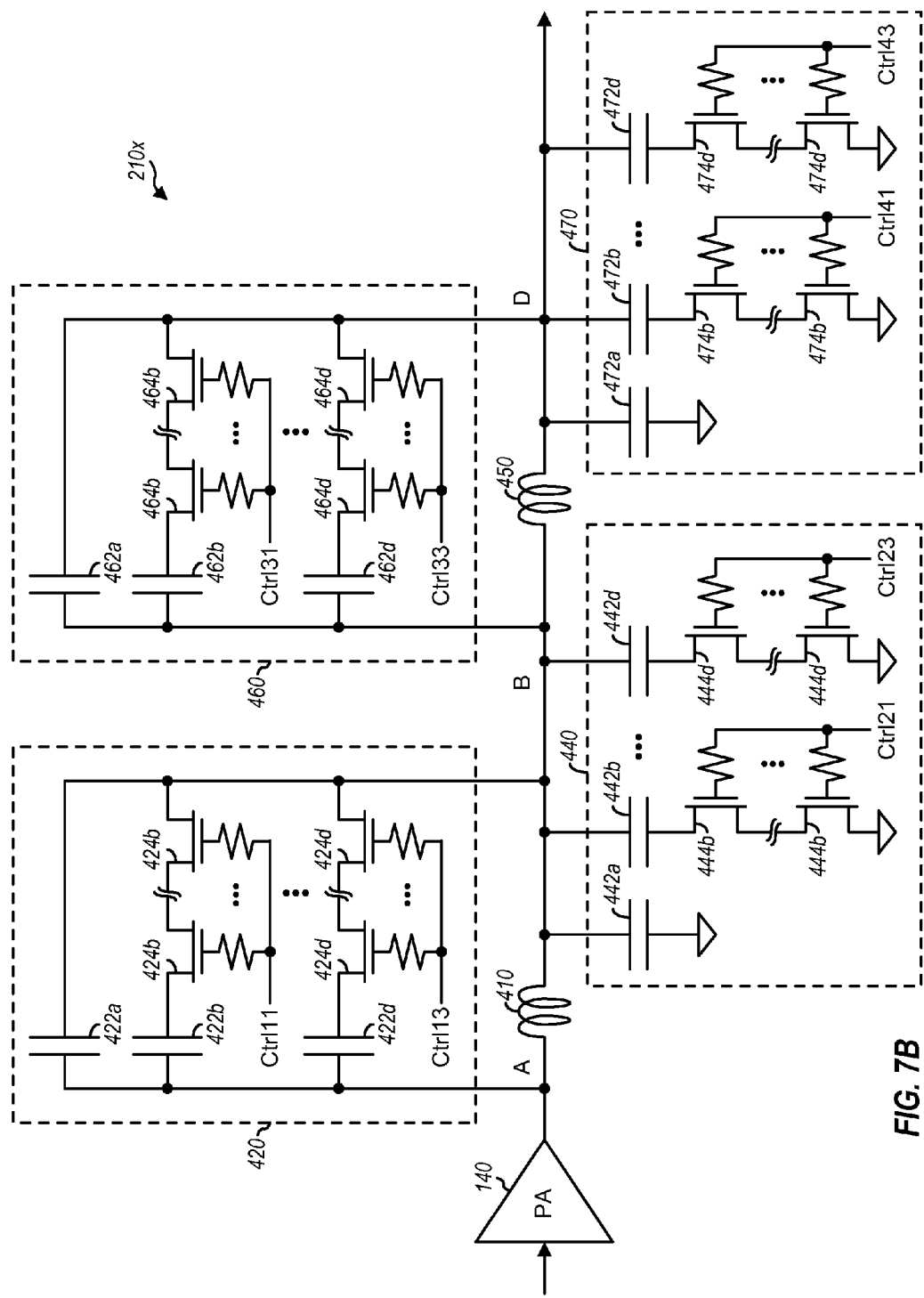

FIG. 7B shows an exemplary design of tunable matching circuit 210x in FIG. 7A using switchable capacitors. In the exemplary design shown in FIG. 7B, variable series capacitor 420 is implemented with capacitors 422a through 422d and MOS transistors 424a through 424d, which are coupled as described above for FIG. 4B. Variable shunt capacitor 440 is implemented with capacitors 442a through 442d and MOS transistors 444a through 444d, which are coupled as described above for FIG. 5B. Variable series capacitor 460 is implemented with capacitors 462a through 462d and MOS transistors 464b through 464d, which are coupled in similar manner as capacitors 422 and MOS transistors 424. Variable shunt capacitor 470 is implemented with capacitors 472a through 472d and MOS transistors 474b through 474d, which are coupled in similar manner as capacitors 442 and MOS transistors 444. In general, any number of fixed and switchable capacitors may be used to implement each of variable capacitors 420, 440, 460 and 470. Furthermore, each fixed or switchable capacitor may have any suitable capacitance value.

Figure 8:
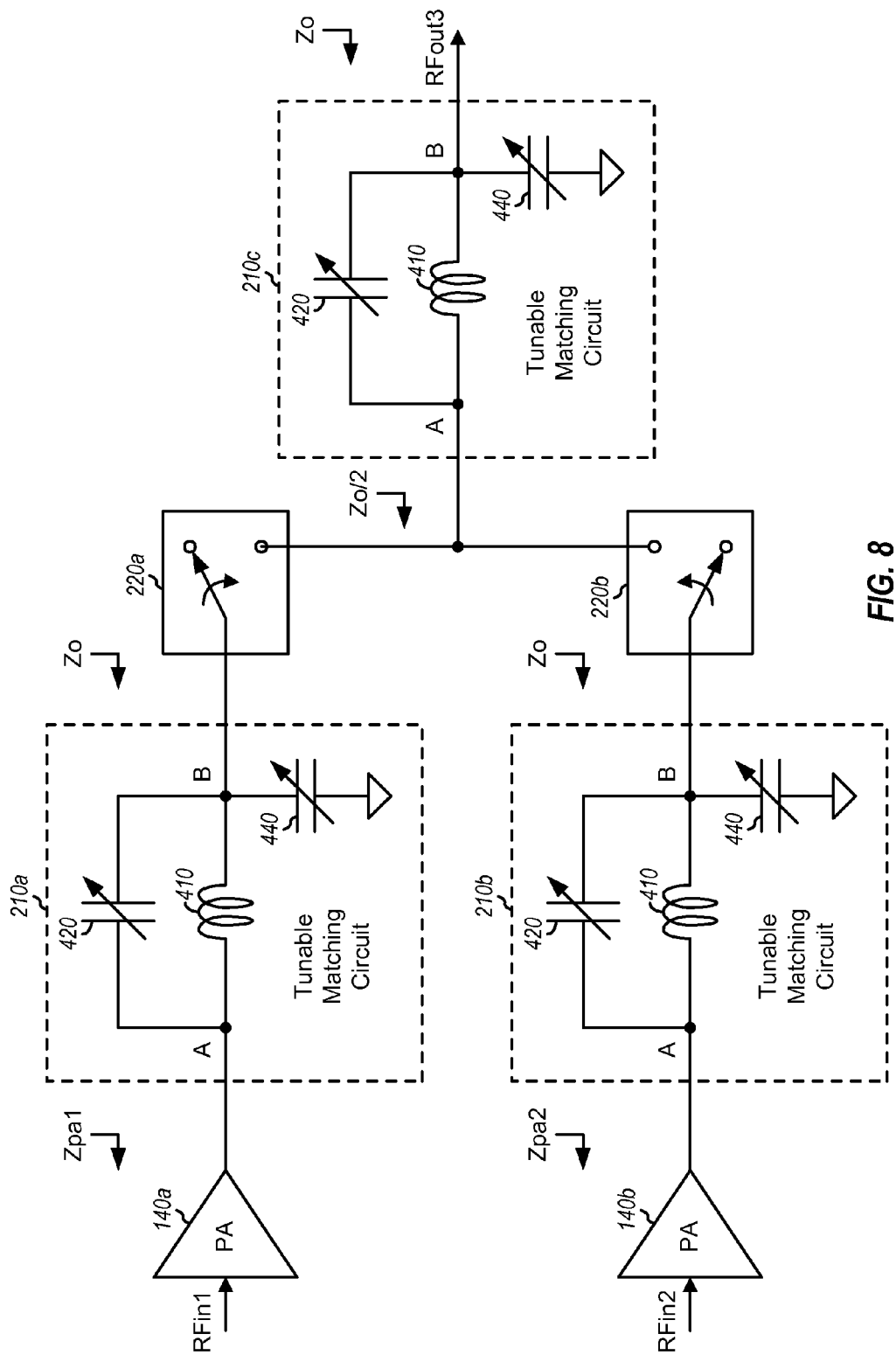
FIG. 8 shows three tunable matching circuits for the output circuit.

FIG. 8 shows an exemplary design of tunable matching circuits 210a, 210b and 210c in FIG. 2. In this exemplary design, each tunable matching circuit 210 is implemented with inductor 410, variable series capacitor 420, and variable shunt capacitor 440, which are coupled as described above for FIG. 6A. Tunable matching circuit 210a matches the output impedance Zpa1 of power amplifier 140a to the load impedance Zo. Similarly, tunable matching circuit 210b matches the output impedance Zpa2 of power amplifier 140b to the load impedance Zo.

Switches 220a and 220b may be configured to couple the outputs of tunable matching circuits 210a and 210b to the input of tunable matching circuit 210c. In this case, tunable matching circuit 210c would observe an input impedance of Zo/2 and would match Zo/2 to the load impedance Zo. Tunable matching circuits 210a, 210b and 210c may have the same topology. However, different values of inductor 410 and/or capacitors 420 and 440 may be used for different tunable matching circuits 210a, 210b and 210c.

In the exemplary designs described above, one or more switchable capacitors may be used to implement a variable capacitor. In another exemplary design, one or more varactors may be used to implement a variable capacitor. A varactor may have a capacitance that may be varied with a control voltage. A varactor may be implemented with a semiconductor device, a micro-electro-mechanical system (MEMS) device, etc.

Tunable matching circuits 210a, 210b and 210c may be adjusted based on various parameters. In an exemplary design, a given tunable matching circuit 210 may be adjusted based on an envelope signal for an associated power amplifier 140. This exemplary design may be used to track variations in the envelop of an output RF signal, e.g., due to a high peak-to-average power ratio (PAPR). For example, the peak output power level may be about 4 dB higher than the average output power level for a CDMA signal. The tuning may attempt to track changes in the output power level due to PAPR.

In another exemplary design, tunable matching circuit 210 may be adjusted based on an average output power level of the associated power amplifier 140. This exemplary design may be especially suitable for RF signals with a constant envelope, such as a GSM signal.

In yet another exemplary design, tunable matching circuit 210 may be adjusted based on measurements for power, voltage and/or current from associated sensor 240. The measurements may be used to detect impedance mismatch and to adjust tunable matching circuit 210 accordingly.

In yet another exemplary design, tunable matching circuit 210 may be adjusted based on a Vdd power supply voltage for associated power amplifier 140. The power supply voltage may be provided by a battery, a DC switching circuit, etc. Power amplifier 140 may operate over a range of power supply voltages. The efficiency of power amplifier 140 typically decreases with higher power supply voltage. It may be desirable to improve the efficiency of power amplifier 140 at higher power supply voltage. It may also be desirable to operate power amplifier 140 at lower power supply voltage. This may support battery technologies that can supply power at lower voltage and thus provide longer operating time. In an exemplary design, different sets of performance plots may be obtained for different power supply voltages for power amplifier 140. Each set of performance plots may be similar to the set of plots shown in FIG. 3 and may be for one specific power supply voltage. Different impedance matching settings may be used for different power supply voltages to achieve good performance, e.g., better PA efficiency and/or better PA performance. For example, the power supply voltage for power amplifier 140 may be measured, and the set of performance plots corresponding to the measured power supply voltage may be used. Different impedance matching settings may then be selected based on this set of performance plots. In another exemplary design, a set of performance plots may be obtained for power amplifier 140 for different power supply voltages with a specific impedance matching setting. One performance plot may be selected for use based on the measured power supply voltage.

Adjusting tunable matching circuit 210 based on the power supply voltage may improve PA efficiency and may also support operation of power amplifier 140 at a lower power supply voltage.

In yet another exemplary design, tunable matching circuit 210 may be adjusted based on temperature observed by associated power amplifier 140. A set of performance plots may be obtained for different temperatures for power amplifier 140. Different impedance matching settings may be used for different temperatures to achieve good performance. For example, the temperature of power amplifier 140 may be sensed, and the set of performance plots corresponding to the sensed temperature may be used. Different impedance matching settings may then be selected based on this set of performance plots.

In yet another exemplary design, tunable matching circuit 210 may be adjusted based on IC process variations. A set of performance plots may be obtained for different IC process corners. Different impedance matching settings may be used for different IC process corners to achieve good performance.

In yet another exemplary design, tunable matching circuit 210 may be adjusted based on frequency band of operation. Different sets of performance plots may be obtained for power amplifier 140 for different frequency bands. The set of performance plots corresponding to a selected frequency band may be used.

In yet another exemplary design, tunable matching circuit 210 may be adjusted based on operating mode. Different sets of performance plots may be obtained for power amplifier 140 for different operating modes, e.g., a linear mode, a saturated mode, etc. The set of performance plots corresponding to the current operating mode of power amplifier 140 may be used.

In yet another exemplary design, tunable matching circuit 210 may be adjusted based on the load. A set of performance plots may be obtained for different load values. Different impedance matching settings may be used for different load values to achieve good performance. Tunable matching circuit 210 may also be adjusted based on other parameters such as harmonics rejection, etc.

Tunable matching circuit 210 may also be adjusted in other manners, e.g., based on other parameters that may affect the operation or performance of power amplifier 140. In an exemplary design, a look-up table may store different impedance matching settings for different parameter values. A suitable impedance matching setting may be obtained by applying the current parameter values to the look-up table.

In an exemplary design, an apparatus may comprise a power amplifier (power amplifier 140*a* in FIG. 2 or 8) and a tunable matching circuit (e.g., tunable matching circuit 210*a*). The power amplifier may amplify an input RF signal and provide an amplified RF signal. The tunable matching circuit may provide output impedance matching for the power amplifier, may receive the amplified RF signal and provide an output RF signal, and may be tunable based on at least one parameter effecting the operation of the power amplifier.

In an exemplary design, the tunable matching circuit may comprise a variable capacitor (e.g., capacitor 420 in FIG. 4A or 6A) coupled in series between the input and output of the tunable matching circuit. Alternatively or additionally, the tunable matching circuit may comprise a variable capacitor (e.g., capacitor 440 in FIG. 5A or 6A) coupled between the output of the tunable matching circuit and circuit ground. Each variable capacitor may be tunable based on the at least one parameter. In another exemplary design, the tunable matching circuit may comprise multiple stages (e.g., as shown in FIGS. 7A and 7B). Each stage may comprise at least one variable capacitor that may be tunable based on the at least one parameter.

The apparatus may further comprise a control unit that may receive information indicative of the at least one parameter and may generate at least one control for the tunable matching circuit based on the received information. The apparatus may further comprise a sensor that may measure the amplified RF signal and/or the output RF signal. The control unit may receive measurements from the sensor and may adjust the tunable matching circuit based on the measurements.

In an exemplary design, the at least one parameter may comprise an envelope signal for the amplified RF signal. The tunable matching circuit may be adjusted based on the envelope signal. In another exemplary design, the parameter(s) may comprise an average output power level of the output RF signal. The tunable matching circuit may be adjusted based on the average output power level. In yet another exemplary design, the parameter(s) may comprise a power supply voltage for the power amplifier. The tunable matching circuit may be adjusted based on the power supply voltage. In yet another exemplary design, the parameter(s) may comprise IC process variations. The tunable matching circuit may be adjusted based on a detected IC process corner for the power amplifier. The tunable matching circuit may also be adjusted based on other parameters.

The apparatus may further comprise a second power amplifier (e.g., power amplifier 140*b* in FIG. 2 or 8) and a second tunable matching circuit (e.g., tunable matching circuit 210*b*). The second power amplifier may amplify a second input RF signal and provide a second amplified RF signal. The second tunable matching circuit may provide output impedance matching for the second power amplifier, may receive the second amplified RF signal and provide a second output RF signal, and may be tunable based on at least one second parameter effecting the operation of the second power amplifier. The apparatus may further comprise a third tunable matching circuit (e.g., tunable matching circuit 210*c*) that may receive the first and second output RF signals and provide a third output RF signal.

In an exemplary design, a wireless device may comprise a power amplifier, a tunable matching circuit, and a control unit, e.g., as shown in FIG. 2. The power amplifier may amplify an input RF signal and provide an amplified RF signal. The tunable matching circuit may provide output impedance matching for the power amplifier and may receive the amplified RF signal and provide an output RF signal. The control unit may generate a control to adjust the tunable matching circuit based on at least one parameter effecting the operation of the power amplifier. The tunable matching circuit may include a variable capacitor coupled in series between the input and output of the tunable matching circuit and/or a variable capacitor coupled between the output and circuit ground. Each variable capacitor may be tunable based on the control from the control unit. The wireless device may further comprise a sensor that may measure the amplified RF signal and/or the output RF signal and may generate the control for the tunable matching circuit based on measurements from the sensor.

Figure 9:
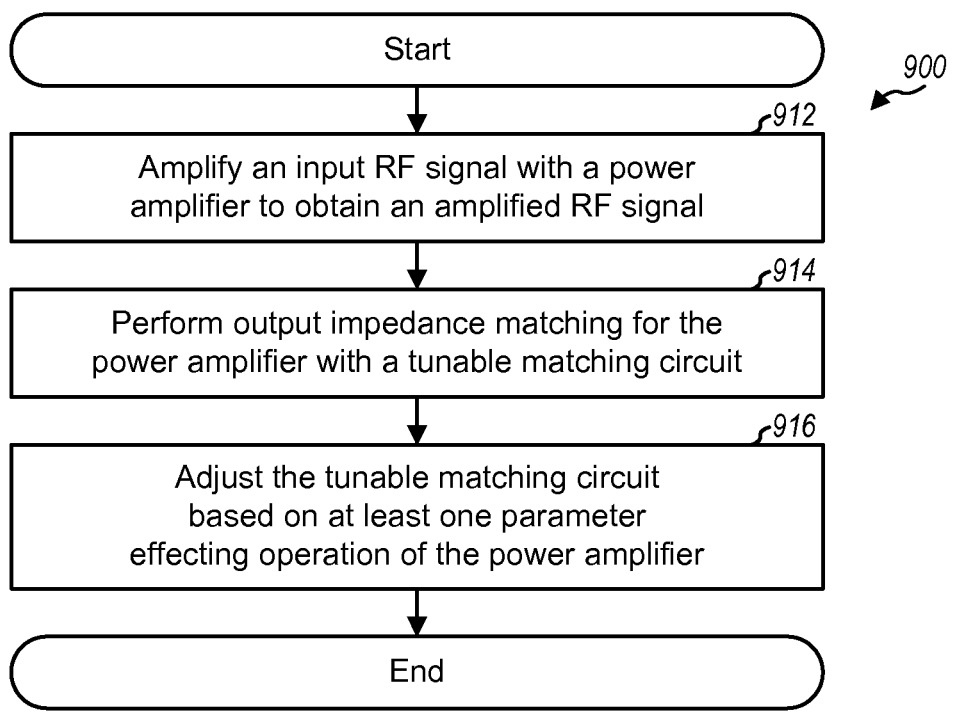
FIG. 9 shows a process for amplifying a signal.

FIG. 9 shows a design of a process 900 for amplifying a signal. An input RF signal may be amplified with a power amplifier to obtain an amplified RF signal (block 912). Output impedance matching may be performed for the power amplifier with a tunable matching circuit (block 914). The tunable matching circuit may be adjusted based on at least one parameter effecting the operation of the power amplifier (block 916). For example, the tunable matching circuit may be adjusted based on an envelope signal for the power amplifier, an average output power level for the power amplifier, a power supply voltage for the power amplifier, etc. In an exemplary design, a variable capacitor in the tunable matching circuit may be adjusted based on a control generated based on the parameter(s). In an exemplary design, the amplified RF signal and/or an output RF signal may be measured, and the tunable matching circuit may be adjusted based on measurements of the amplified RF signal and/or the output RF signal.

The tunable matching circuits described herein may be implemented on an IC, an analog IC, an RFIC, a mixed-signal IC, an ASIC, a printed circuit board (PCB), an electronics device, etc. The tunable matching circuits may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the tunable matching circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a power amplifier amplifying an input radio frequency (RF) signal and providing an amplified RF signal;
   a tunable matching circuit coupled to the power amplifier and providing output impedance matching for the power amplifier, the tunable matching circuit receiving the amplified RF signal and providing an output RF signal, the tunable matching circuit being adaptively tunable to a setting based on at least one parameter affecting operation of the power amplifier, the setting causing a power efficiency of the power amplifier to be greater than a power efficiency at a different setting; and
   at least one sensor coupled to each of an output of the power amplifier and an output of the tunable matching circuit and configured to measure at least one property of each of the amplified RF signal and the output RF signal.

2. The apparatus of claim 1, the tunable matching circuit comprising
   a variable capacitor coupled in series between an input and an output of the tunable matching circuit, the variable capacitor being tunable based on the at least one parameter.

3. The apparatus of claim 1, the tunable matching circuit comprising
   a variable capacitor coupled between an output of the tunable matching circuit and circuit ground, the variable capacitor being tunable based on the at least one parameter.

4. The apparatus of claim 2, the tunable matching circuit further comprising
   a second variable capacitor coupled between the output of the tunable matching circuit and circuit ground, the second variable capacitor being tunable generated based on the at least one parameter.

5. The apparatus of claim 1, the tunable matching circuit comprising multiple stages, each stage comprising at least one variable capacitor tunable based on the at least one parameter.

6. The apparatus of claim 1, further comprising:
   a control unit receiving information indicative of the at least one parameter and generating at least one control for the tunable matching circuit based on the received information.

7. The apparatus of claim 1, the at least one parameter comprising an envelope signal for the amplified RF signal, and the tunable matching circuit being adjusted based on the envelope signal.

8. The apparatus of claim 1, the at least one parameter comprising an average output power level of the output RF signal, and the tunable matching circuit being adjusted based on the average output power level.

9. The apparatus of claim 1, the at least one parameter comprising a power supply voltage for the power amplifier, and the tunable matching circuit being adjusted based on the power supply voltage.

10. The apparatus of claim 1, the at least one parameter comprising integrated circuit (IC) process variations, and the tunable matching circuit being adjusted based on a detected IC process corner for the power amplifier.

11. The apparatus of claim 1, the at least one parameter comprising temperature, frequency band, load, harmonic rejection, operating mode of the power amplifier, or a combination thereof.

12. The apparatus of claim 1, further comprising:
   a second power amplifier amplifying a second input RF signal and providing a second amplified RF signal; and
   a second tunable matching circuit coupled to the second power amplifier and providing output impedance matching for the second power amplifier, the second tunable matching circuit receiving the second amplified RF signal and providing a second output RF signal, the second tunable matching circuit being tunable based on at least one second parameter affecting operation of the second power amplifier.

13. The apparatus of claim 12, further comprising:
   a third tunable matching circuit coupled to the first and second tunable matching circuits, the third tunable matching circuit receiving the first and second output RF signals and providing a third output RF signal.

14. The apparatus of claim 1, further comprising:
   a sensor coupled to the tunable matching circuit and measuring the amplified RF signal, or the output RF signal, or both; and
   a control unit receiving measurements from the sensor and adjusting the tunable matching circuit based on the measurements.

15. A wireless device comprising:
   a power amplifier amplifying an input radio frequency (RF) signal and providing an amplified RF signal;
   a tunable matching circuit coupled to the power amplifier and providing output impedance matching for the power amplifier, the tunable matching circuit receiving the amplified RF signal and providing an output RF signal;

at least one sensor coupled to each of an output of the power amplifier and an output of the tunable matching circuit and configured to measure at least one property of each of the amplified RF signal and the output RF signal; and a control unit generating a control to adjust the tunable matching circuit to a setting based on at least one parameter affecting operation of the power amplifier, the setting causing a power efficiency of the power amplifier to be greater than a power efficiency at a different setting.

16. The wireless device of claim 15, the tunable matching circuit comprising a variable capacitor coupled in series between an input and an output of the tunable matching circuit, the variable capacitor being tunable based on the control from the control unit.

17. The wireless device of claim 15, further comprising:

a sensor coupled to the tunable matching circuit and measuring the amplified RF signal, or the output RF signal, or both, the control unit generating the control for the tunable matching circuit based on measurements from the sensor.

18. A method of performing signal amplification, comprising:

amplifying an input radio frequency (RF) signal with a power amplifier to obtain an amplified RF signal;

performing output impedance matching for the power amplifier with a tunable matching circuit;

sensing at least one property of each of the amplifier RF signal and an output of the tunable matching circuit; and adaptively adjusting the tunable matching circuit to a setting based on at least one parameter affecting operation of the power amplifier, the setting causing a power efficiency of the power amplifier to be greater than a power efficiency at a different setting.

19. The method of claim 18, the adjusting the tunable matching circuit comprising adjusting the tunable matching circuit based on an envelope signal for the power amplifier, an average output power level of the power amplifier, a power supply voltage for the power amplifier, or any combination thereof.

20. The method of claim 18, the adjusting the tunable matching circuit comprising measuring the amplified RF signal, or an output RF signal from the tunable matching circuit, or both, and adjusting the tunable matching circuit based on measurements of the amplified RF signal, or the output RF signal, or both.

21. The method of claim 18, the adjusting the tunable matching circuit comprising generating a control based on the at least one parameter, and adjusting a variable capacitor in the tunable matching circuit based on the control.

22. An apparatus comprising:

means for amplifying an input radio frequency (RF) signal to obtain an amplified RF signal;

means for matching an output impedance of the means for amplifying;

means for sensing at least one property of each of the amplifier RF signal and an output of the tunable matching circuit; and means for adaptively adjusting the means for matching the output impedance to a setting based on at least one parameter affecting operation of the means for amplifying, the setting causing a power efficiency of the means for amplifying to be greater than a power efficiency at a different setting.

* * * * *